(12) United States Patent
Petitdidier et al.

(10) Patent No.: US 10,186,491 B2
(45) Date of Patent: Jan. 22, 2019

(54) INTEGRATED CIRCUIT CHIP REINFORCED AGAINST FRONT SIDE DEPROCESSING ATTACKS

(71) Applicants: STMicroelectronics (Crolles 2) SAS, Crolles (FR); STMicroelectronics (Rousset) SAS, Rousset (FR)

(72) Inventors: Sébastien Petitdidier, La Terrasse (FR); Mathieu Lisart, Aix en Provence (FR)

(73) Assignees: STMicroelectronics (Crolles 2) SAS, Crolles (FR); STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/606,212

(22) Filed: May 26, 2017

(65) Prior Publication Data

US 2018/0102328 A1    Apr. 12, 2018

(30) Foreign Application Priority Data

Oct. 11, 2016 (FR) ........................................ 16 59803

(51) Int. Cl.
*H01L 23/00* (2006.01)
*H01L 21/768* (2006.01)
*H01L 23/522* (2006.01)

(52) U.S. Cl.
CPC ...... *H01L 23/573* (2013.01); *H01L 21/76802* (2013.01); *H01L 21/76831* (2013.01); *H01L 23/522* (2013.01); *H01L 23/5226* (2013.01)

(58) Field of Classification Search
CPC ............. H01L 21/76898; H01L 23/481; H01L 21/76807

USPC ........................................................ 257/773
See application file for complete search history.

(56) References Cited

U.S. PATENT DOCUMENTS

| | | | |
|---|---|---|---|
| 5,516,729 A | 5/1996 | Dawson et al. | |
| 7,453,150 B1* | 11/2008 | McDonald | H01L 21/76898 257/773 |
| 8,314,483 B2* | 11/2012 | Lin | H01L 21/76898 257/686 |
| 9,478,508 B1* | 10/2016 | LaRoche | H01L 21/76877 |
| 9,764,153 B2* | 9/2017 | Tsai | A61N 1/3931 |
| 2002/0096744 A1 | 7/2002 | Chow et al. | |
| 2010/0178761 A1* | 7/2010 | Chen | H01L 21/76898 438/613 |
| 2013/0093098 A1* | 4/2013 | Yang | H01L 21/76898 257/774 |

(Continued)

FOREIGN PATENT DOCUMENTS

JP     2003051537 A     2/2003

OTHER PUBLICATIONS

INPI Search Report and Written Opinion for FR 1659803 dated Sep. 25, 2017 (8 pages).

*Primary Examiner* — David Vu
*Assistant Examiner* — Brandon Fox
(74) *Attorney, Agent, or Firm* — Crowe & Dunlevy

(57) ABSTRACT

An integrated circuit chip includes an interconnection stack with a cavity formed therein. The cavity extends through one or more interconnection levels of the stack. A material at least partially fills the cavity. The fill material has a selectivity to polishing and/or to etching different by more than 10% from a selectivity to polishing and/or to etching of a material forming an insulator of the interconnection stack.

40 Claims, 2 Drawing Sheets

(56) References Cited

U.S. PATENT DOCUMENTS

2013/0264688 A1* 10/2013 Qian ................. H01L 21/76898
  257/622
2015/0270215 A1* 9/2015 Peng ................... H01L 23/5226
  257/751

\* cited by examiner

INTEGRATED CIRCUIT CHIP REINFORCED AGAINST FRONT SIDE DEPROCESSING ATTACKS

PRIORITY CLAIM

This application claims the priority benefit of French Application for Patent No. 1659803, filed on Oct. 11, 2016, the disclosure of which is hereby incorporated by reference in its entirety.

TECHNICAL FIELD

The present disclosure relates to electronic chips reinforced against deprocessing attacks carried out from the front side.

BACKGROUND

Firms or pirates often attempt to analyze the operation and the composition of an integrated circuit chip.

The peeling of the successive interconnection layers of a chip and the analysis thereof is a reverse engineering deprocessing technique enabling to obtain information relative to the chip operation. This technique comprises observing metallizations, for example, made of copper, which form the different connections.

During the analysis of a chip, the elements located on the chip are removed to reach an interconnection layer, which is observed. The metallizations forming that layer, and one or a plurality of insulators surrounding the metallizations, are then removed by etching or polishing, according to the material. The next interconnection layer is thus exposed and can be similarly observed. This layer is then removed in turn, and the process is repeated until observation of all interconnection layers is completed.

Such operations are carried out on a single chip, and not on a full wafer of chips. The key issue of such operations is the ability to accurately remove the layers one by one and to level them properly. Indeed, if certain regions are more (or less) exposed than the neighboring regions, the analysis will be disturbed. For example, such a difference will disturb the rest of the process by causing the etching of materials belonging to an interconnection level different from that considered at a given time, and thus the possible destruction of connections which have not yet been analyzed.

There is a need in the art for a chip structure that makes the implementation of reverse engineering techniques, such as the deprocessing of interconnection layers described here-above, difficult, or even impossible.

SUMMARY

An embodiment provides an integrated circuit chip comprising a stack of interconnection levels, each interconnection level being formed of a layer of insulator having at least one metallization formed therein, the stack having a cavity, filled with at least a first material having a polishing and/or etching speed (rate) different by at least 10% from that of the material forming the layers of said insulator, formed therein.

According to an embodiment, a plurality of cavities is formed in the integrated circuit chip.

According to an embodiment, the cavity is formed all throughout the interconnection stack.

According to an embodiment, an upper portion of the cavity is not filled with said at least one first material.

According to an embodiment, said upper portion contains at least one metallization.

According to an embodiment, the cross-section of the cavity is in the range from 0.2 to 1 µm.

An embodiment provides a manufacturing method comprising: forming a cavity in a stack of interconnection levels of a chip, each interconnection level being formed of a layer of insulator having at least one metallization formed therein; and at least partially filling the cavity with at least one first material having a polishing and/or etching speed (rate) different by at least 10% from that of the material forming the layers of said insulator.

According to an embodiment, the method comprises simultaneously forming a plurality of cavities.

According to an embodiment, the method comprises forming at least one interconnection level above the cavity.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
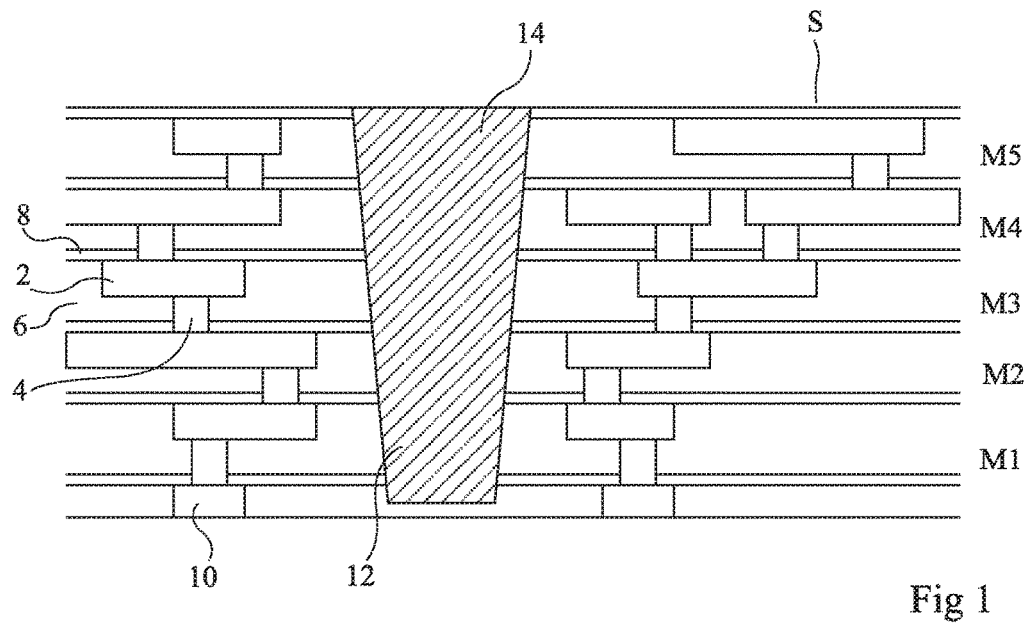
FIG. 1 is a cross-section view of an embodiment of a reinforced chip.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying the position and orientation such as "front", "top", "above", "under", "upper", "lower", etc., reference is made to the orientation of the drawings.

FIG. 1 illustrates an embodiment of an integrated circuit chip with five interconnection levels (M1-M5). The chip is reinforced against front-side attacks. Each interconnection level comprises metallizations (metal lines) 2 and vias 4. A metallization 2 in one interconnection level is connected to a metallization 2 of another interconnection level by the via 4. In the embodiment illustrated in FIG. 1, the metallizations 2 of a same interconnection level are formed in a same insulator layer 6. An etch stop insulator layer 8 is formed above each interconnection level. The vias 4 of the interconnection level most distant from the upper surface S are connected to contact areas 10 of the components formed in the chip. Insulator 6 is, for example, a dielectric material of low electric permittivity, such as, for example, porous SiOC and insulator 8 is, for example, SiN or SiCN. Metallizations 2 and vias 4 are, for example, made of copper.

A cavity 12 is formed in the insulator layers 6 and 8 of these five interconnection levels M1-M5. Cavity 12 is filled with a material 14 having a polishing and/or etching speed (rate) different by at least 10% from a polishing and/or etching speed (rate) of the material forming layers of insulator 6 of the interconnection levels. Material 14 may, for example, be dense silicon nitride or silicon oxide, for example, formed by chemical vapor deposition (so-called CVD method) from tetraethyl orthosilicate (TEOS).

As a variation, the walls of cavity 12 may be covered with a liner made by a conformal layer of a cladding material, with the lined cavity 12 then being filled with a filling material. The cladding material may, for example, be silicon nitride or silicon oxide (TEOS). A layer of tantalum and/or tantalum nitride, or of titanium and/or of titanium nitride, may possibly be added to the cladding layer. The filling material may, for example, be a metal material such as tungsten or aluminum.

In case of a deprocessing attack attempt on the front side of the chip by successive removal of the layers forming the interconnection levels, the removal of layers of insulator 6, by polishing or by etching, either leaves a raised portion of filling material 14 within the cavities 12, or creates a depression in the filling material 14 within the cavities 12. The presence of a raised portion or of a depression disturbs the subsequent steps of removal of the layers forming the interconnection levels.

Cavities 12 may be formed at a plurality of locations on each chip. These locations are preferably selected irregularly, which makes their positions difficult to anticipate.

The dimensions of the different cavities 12 of a same chip may be variable. The dimension of a width of the cavity 12 extending parallel to the surface S are preferably in the range from 0.2 to 1 µm. The shape of cavity 12 in a plan (top) view may also be variable. In particular, a cross-section of cavity 12 taken parallel to the surface S may, for example, have a round, oval, square shape or any other shape capable of being obtained with existing technologies. The structure may be coated with aluminum screens making its analysis more difficult. Although this device may be particularly useful in the case of read-only memories (ROMs) containing secret data, it is not limited to this type of application.

Figure 2:
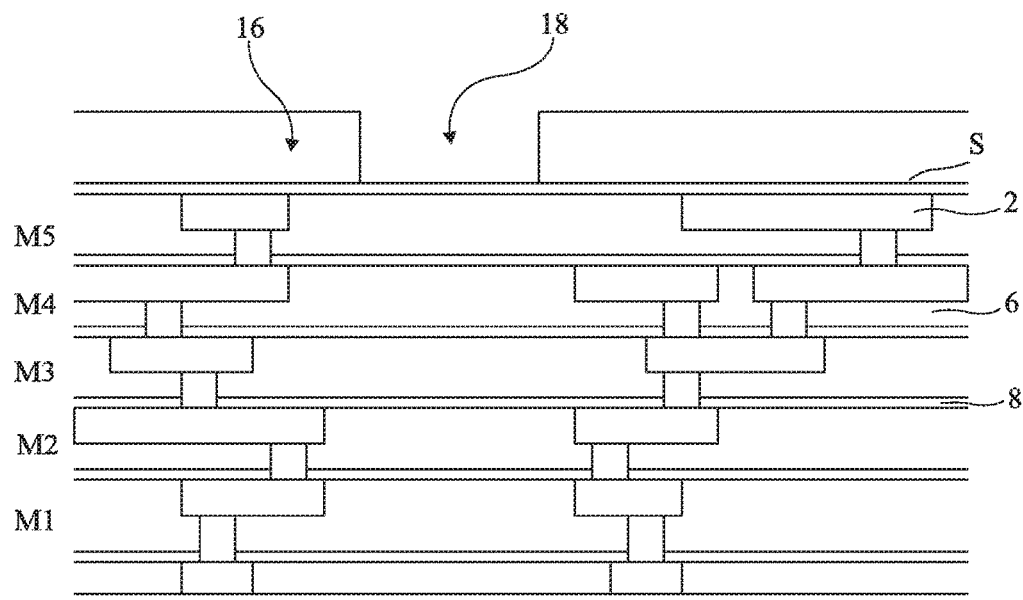
FIGS. 2 to 4 are cross-section views illustrating manufacturing steps of the embodiment of FIG. 1.
Figure 3:
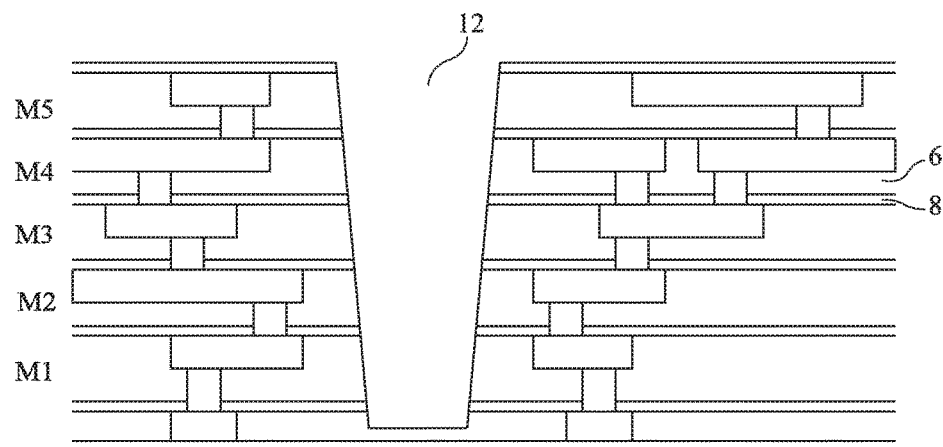
Figure 4:
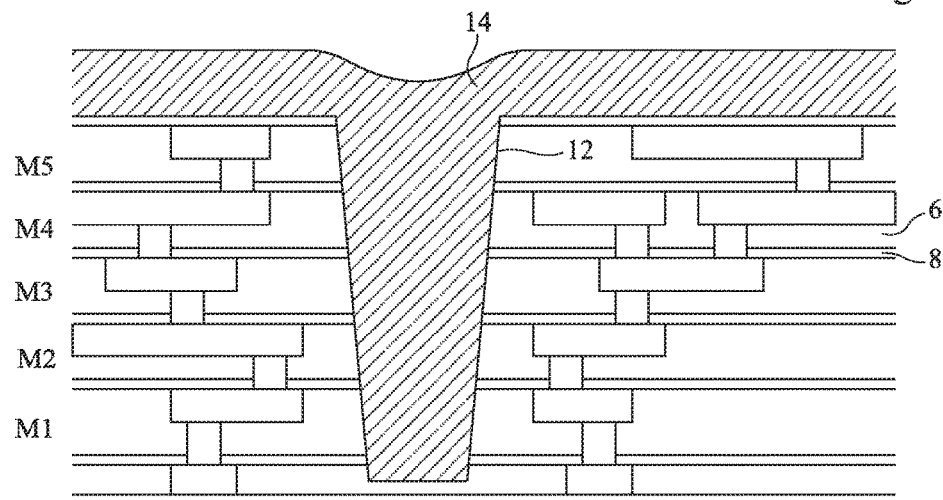

FIGS. 2 to 4 illustrate the successive steps of manufacturing of the structure described in relation with FIG. 1.

At the step of FIG. 2, the different interconnection levels M1-M5 have been formed on the chip. The locations where cavities 12 will be formed have been previously selected and no metallization 2 is formed in any level M1-M5 at such locations. Only insulator layers 6 and 8 are present at such locations. A mask 16 is formed on the chip surface S and comprises openings 18 at the locations where cavities 12 are desired to be formed.

At the step illustrated in FIG. 3, a cavity 12 is formed in insulator layers 6 and 8 through the opening 18 left in mask 16. Cavity 12 is formed by successive selective anisotropic etchings of the successive insulating layers 6 and 8 of the levels M1-M5. These etchings are, for example, plasma etchings. The cavity extends completely through all of the interconnection levels M1-M5 in a preferred implementation. Mask 16 is then removed from the chip surface S.

At the step illustrated in FIG. 4, a layer of a material 14 is uniformly deposited, for example, by sputtering. The thickness of layer 14 of material is sufficient to fill cavity 12. The chip is then polished, for example, by chemical-mechanical polishing (CMP), to remove the material 14 located outside of cavity 12 to the level of the surface S.

As a variation, as described in relation with FIG. 1, the material 14 filling cavity 12 may comprise one or a plurality of cladding materials and a filling material. In the same way as for the layer of material 14, the total thickness of the layers of cladding and filling materials is sufficient to fill cavity 12. The materials located outside of cavity 12 are removed, for example, by chemical-mechanical polishing to the level of the surface S.

Material 14, in the same way as the previously-mentioned filling materials, have a polishing and/or etching speed (rate) different by at least 10% from a polishing and/or etching speed (rate) of the material forming layers of insulator 6 of the interconnection levels. Thus, during an attempt to polish an interconnection level of the chip, material 14 of cavity 12 will be removed slower or faster than the neighboring materials and will form a raised area or a depression, respectively, on the chip surface. This unevenness may make the analysis of the successive metallizations difficult and may, for example, cause, in the case of a depression, the etching of an interconnection level that is lower than the interconnection level being analyzed at a given time.

Figure 5:
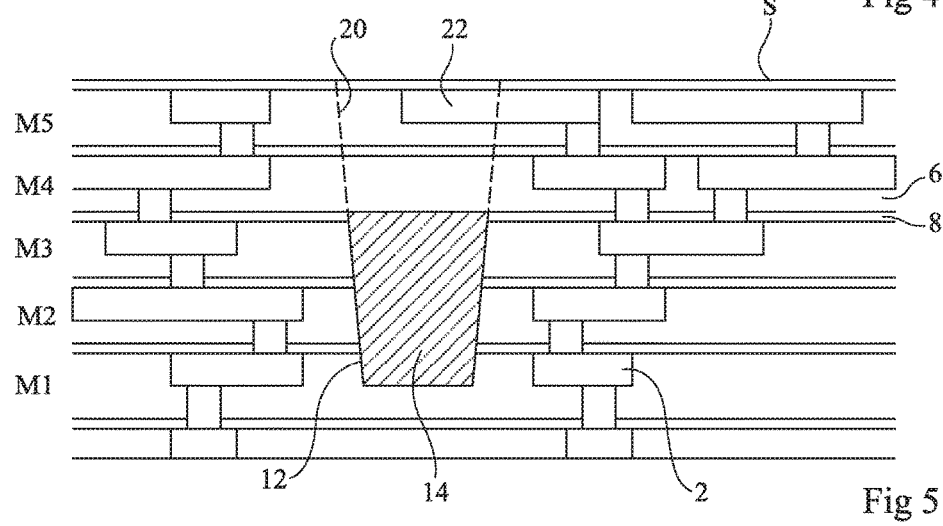
FIG. 5 is a cross-section view illustrating an alternative embodiment.

FIG. 5 illustrates another embodiment. Cavity 12 of this structure only extends completely though part of the height of the interconnection levels. For example, cavity 12 has not been dug down to and through the interconnection level M1 that is located most distant from the surface S. Additionally, not all of the cavity 12 is filled with the material 14. For example, an upper portion 20, located above cavity 12 and surrounded with dotted lines in FIG. 5, may be filled with one or a plurality of other materials. In the structure of FIG. 5, layers of insulator 6 and 8 as well as a metallization 22 have been formed in upper portion 20.

As a variation, cavity 12 may be dug through all the insulating layers 6 and 8 of the interconnection levels M1-M5 and be only partially filled with material 14 before being covered with other materials in one or more upper levels closer to the surface S. Cavity 12 may also be dug only through a few layers of insulator 6 and 8, for example, three layers M3-M5) of insulator 6 and two layers of insulator 8, and be entirely filled with material 14. In this case, it is possible to have metallizations 2 in the interconnection levels M1-M2 under the cavity.

An advantage of these embodiments is that they use current technologies, generally used in the method of manufacturing an integrated circuit chip.

Specific embodiments have been described. Various alterations, modifications, and improvements will readily occur to those skilled in the art. In particular, the various materials used may be replaced with equivalent materials.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit chip, comprising:
   a stack of interconnection levels, each interconnection level including a layer of insulator and having at least one metallization therein;
   wherein the stack includes a cavity;
   at least a first material within said cavity, the first material having one of a polishing and etching speed that is different by at least 10% from a corresponding one of a polishing and etching speed of a material forming the layer of insulator for the interconnection levels, wherein an upper portion of the cavity does not include said at least one first material; and
   at least one metallization within said upper portion of the cavity.

2. The integrated circuit chip of claim 1, wherein the stack includes a plurality of cavities, including said at least a first material present within each cavity.

3. The integrated circuit chip of claim 1, wherein the cavity extends through all interconnection levels of the stack.

4. The integrated circuit chip of claim 1, wherein a dimension of the cavity is in a range from 0.2 to 1 µm.

5. A manufacturing method, comprising:
forming a cavity in a stack of interconnection levels of a chip, each interconnection level including a layer of insulator and having at least one metallization therein;
at least partially filling the cavity with at least one first material having one of a polishing and etching speed that is different by at least 10% from a corresponding one of a polishing and etching speed of a material forming the layer of insulator for the interconnection levels; and
forming at least one interconnection level within the cavity above the partial fill of the at least one first material.

6. The manufacturing method of claim 5, comprising simultaneously forming a plurality of cavities in the stack of interconnection levels of the chip.

7. The manufacturing method of claim 5, further comprising depositing a conformal insulating liner on walls of the cavity prior to said at least partially filling.

8. An integrated circuit chip, comprising:
a stack of interconnection levels over a semiconductor substrate, each interconnection level including a layer of insulator and having at least one metallization therein, wherein the layer of insulator is formed with a first nonmetallic material;
wherein the stack includes a cavity that extends through interconnection levels of the stack but does not reach an upper surface of the semiconductor substrate; and
at least a second nonmetallic material within said cavity, the second nonmetallic material and having one of a polishing and etching speed that is different by at least 10% from a corresponding one of a polishing and etching speed of the first nonmetallic material forming the layer of insulator for the interconnection levels.

9. The integrated circuit chip of claim 8, wherein the second nonmetallic material shares at least a common nonmetallic element with the first nonmetallic material.

10. The integrated circuit chip of claim 9, wherein the common nonmetallic element is silicon.

11. The integrated circuit chip of claim 8, wherein the first nonmetallic material has the same chemical composition as the second nonmetallic material.

12. The integrated circuit chip of claim 8, wherein the first nonmetallic material has a lower density than that of the second nonmetallic material.

13. The integrated circuit chip of claim 8, wherein the first nonmetallic material is SiOC, and the second nonmetallic material is SiN.

14. The integrated circuit chip of claim 8, wherein the first nonmetallic material is SiCN, and the second nonmetallic material is SiN.

15. The integrated circuit chip of claim 8, wherein both the first nonmetallic material and the second nonmetallic material consist of SiN.

16. The integrated circuit chip of claim 8, wherein the first nonmetallic material is SiOC, and the second nonmetallic material is $SiO_2$.

17. The integrated circuit chip of claim 8, wherein the first nonmetallic material is SiN, and the second nonmetallic material is $SiO_2$.

18. The integrated circuit chip of claim 8, wherein the first nonmetallic material is SiCN, and the second nonmetallic material is $SiO_2$.

19. The integrated circuit chip of claim 8, wherein the stack includes a plurality of cavities, including said at least a first material present within each cavity.

20. The integrated circuit chip of claim 8, wherein the cavity extends through all interconnection levels of the stack.

21. A manufacturing method, comprising:
forming a cavity in a stack of interconnection levels over a semiconductor substrate, each interconnection level including a layer of insulator and having at least one metallization therein, wherein the layer of insulator is made of a first nonmetallic material, wherein the cavity extends through interconnection levels of the stack but does not reach an upper surface of the semiconductor substrate; and
at least partially filling the cavity with at least a second nonmetallic material having one of a polishing and etching speed that is different by at least 10% from a corresponding one of a polishing and etching speed of the first nonmetallic material of the layer of insulator.

22. The method of claim 21, wherein the second nonmetallic material shares at least a common nonmetallic element with the first nonmetallic material.

23. The method of claim 22, wherein the common nonmetallic element is silicon.

24. The method of claim 21, wherein the first nonmetallic material has the same chemical composition as the second nonmetallic material.

25. The method of claim 21, wherein the first nonmetallic material has a lower density than that of the second nonmetallic material.

26. The method of claim 21, wherein the first nonmetallic material is SiOC, and the second nonmetallic material is SiN.

27. The method of claim 21, wherein the first nonmetallic material is SiCN, and the second nonmetallic material is SiN.

28. The method of claim 21, wherein both the first nonmetallic material and the second nonmetallic material consist of SiN.

29. The method of claim 21, wherein the first nonmetallic material is SiOC, and the second nonmetallic material is $SiO_2$.

30. The method of claim 21, wherein the first nonmetallic material is SiN, and the second nonmetallic material is $SiO_2$.

31. The method of claim 21, wherein the first nonmetallic material is SiCN, and the second nonmetallic material is $SiO_2$.

32. The method of claim 21, wherein forming the cavity comprises extending the cavity through all interconnection levels of the stack.

33. An integrated circuit chip, comprising:
a semiconductor substrate;
a stack of interconnection levels over the semiconductor substrate, each interconnection level including a layer of insulator and having at least one metallization therein;
wherein the stack includes a cavity that extends through at least a portion of the stack but does not extend into the semiconductor substrate; and
at least a first material within said cavity, the first material having one of a polishing and etching speed that is different by at least 10% from a corresponding one of a polishing and etching speed of a material forming the layer of insulator for the interconnection levels.

34. The integrated circuit chip of claim 33, wherein the cavity extends completely through all interconnection levels of the stack but does not extend into the semiconductor substrate.

35. The integrated circuit chip of claim 33, wherein an upper portion of the cavity does not include said at least one first material.

36. The integrated circuit chip of claim 35, further including at least one metallization within said upper portion of the cavity.

37. The integrated circuit chip of claim 33, wherein a dimension of the cavity is in a range from 0.2 to 1 μm.

38. A manufacturing method, comprising:
    forming stack of interconnection levels above a semiconductor substrate, each interconnection level including a layer of insulator and having at least one metallization therein;
    forming a cavity that extends through at least a portion of the stack but does not extend into the semiconductor substrate; and
    at least partially filling the cavity with at least one first material having one of a polishing and etching speed that is different by at least 10% from a corresponding one of a polishing and etching speed of a material forming the layer of insulator for the interconnection levels.

39. The manufacturing method of claim 38, comprising forming at least one interconnection level within the cavity above the partial fill of the at least one first material.

40. The manufacturing method of claim 38, further comprising depositing a conformal insulating liner on walls of the cavity prior to said at least partially filling.

* * * * *